(12) United States Patent
Leigh et al.

(10) Patent No.: US 8,964,384 B2
(45) Date of Patent: Feb. 24, 2015

(54) COMPONENT COOLING

(75) Inventors: Kevin B Leigh, Houston, TX (US); George D Megason, Spring, TX (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 286 days.

(21) Appl. No.: 13/560,356

(22) Filed: Jul. 27, 2012

(65) Prior Publication Data

US 2014/0030900 A1  Jan. 30, 2014

(51) Int. Cl.
*H05K 7/20* (2006.01)
*H01R 13/00* (2006.01)

(52) U.S. Cl.
USPC ........... 361/689; 361/694; 361/719; 439/196; 439/485

(58) Field of Classification Search
USPC ......................... 361/691, 694–695, 702, 719; 257/721–722; 439/485, 487, 196
See application file for complete search history.

(56) References Cited

U.S. PATENT DOCUMENTS

| | | | | |
|---|---|---|---|---|
| 4,038,488 A | * | 7/1977 | Lin | 174/50.54 |
| 4,928,207 A | * | 5/1990 | Chrysler et al. | 361/700 |
| 5,183,104 A | * | 2/1993 | Novotny | 165/104.33 |
| 5,349,831 A | * | 9/1994 | Daikoku et al. | 62/376 |
| 5,728,972 A | * | 3/1998 | Hsu | 174/535 |
| 6,829,147 B2 | * | 12/2004 | Streltsov | 361/729 |
| 6,888,720 B2 | * | 5/2005 | Pfister et al. | 361/689 |
| 6,973,801 B1 | * | 12/2005 | Campbell et al. | 62/259.2 |
| 7,068,515 B2 | | 6/2006 | Harris et al. | |
| 7,285,851 B1 | * | 10/2007 | Cepeda-Rizo et al. | 257/712 |
| 7,916,483 B2 | * | 3/2011 | Campbell et al. | 361/702 |
| 8,018,720 B2 | | 9/2011 | Campbell et al. | |
| 8,044,506 B2 | * | 10/2011 | Yun et al. | 257/714 |
| 8,102,651 B2 | | 1/2012 | Bland et al. | |
| 8,203,842 B2 | * | 6/2012 | Campbell et al. | 361/699 |
| 8,542,488 B2 | * | 9/2013 | Peterson et al. | 361/699 |
| 2009/0034327 A1 | * | 2/2009 | Yun et al. | 365/174 |
| 2011/0116225 A1 | * | 5/2011 | Staben et al. | 361/679.46 |
| 2011/0304979 A1 | * | 12/2011 | Peterson et al. | 361/679.47 |
| 2012/0160459 A1 | * | 6/2012 | Flotta et al. | 165/104.27 |
| 2014/0002979 A1 | * | 1/2014 | Leigh et al. | 361/679.31 |

OTHER PUBLICATIONS

Frederick, R.L., Heat Transfer in Cubical Enclosures. Effect of the Posistion of the Hot Source, (Research Paper).
Loffink, J. et al., Dell Poweredge M1000e Modular Enclosure Architecture. (Research Paper), Jan. 2008.
Optimizing Facility Operation in High Density Data Center Environments, (Research Paper), Aug. 2007.

\* cited by examiner

*Primary Examiner* — Robert J Hoffberg
(74) *Attorney, Agent, or Firm* — Hewlett-Packard Patent Department (57) ABSTRACT

Embodiments provide methods, apparatuses, and systems for providing a cooling flow to a component. In various examples, a chip socket may include a cavity configured to couple to the component. The chip socket may include a first channel and a second channel. The first channel may act as an ingress channel while the second channel may act as an egress channel. The ingress and egress channels may be configured to facilitate cooling of the component.

19 Claims, 7 Drawing Sheets

COMPONENT COOLING

BACKGROUND

Computing components such as integrated circuits are often packaged and configured for disposition on a printed circuit board (PCB). The computing components, for example memory and processing units, may be coupled to a PCB in a number of manners. Some computing components may be coupled directly to a PCB using solder or mechanical retention. Other computing components may be coupled to a PCB via a socket or component configured to secure the components to the PCB.

DETAILED DESCRIPTION

Computing components, such as integrated circuits, may be packaged and configured for disposition on a printed circuit board (PCB) to form a printed circuit assembly (PCA). The PCA may be intended to provide functionality to an overall system. As the components mounted on the PCB are utilized, they may release energy in the form of heat. As heat builds within the system, various components may cease to function properly and/or efficiencies may decrease.

Various methods and devices may be employed to facilitate the extraction of heat from the components. For example, various components may be disposed on PCBs for use in computer systems. Computer systems, for example server systems, may be grouped into a data center computer room for efficient transportation, use, and monitoring. Within the data center computer room, the multiple components within multiple servers may generate heat.

Various methods of cooling the components and the servers include providing cool air via under-floor or suspended cold air plenums coupled to a cool air generator, and providing hot air extractions via in-ceiling or suspended hot air plenums. In another example, fans installed within systems may be utilized to pull cool air from the cold aisle through the system front bezel and congested system components. The heated air generated within the system may then be evacuated through the system by blowing the heated air out to the rear of the system to enable additional cool air to enter from the front. These methods, while enabling cool air to enter a system, fail to efficiently cool individual components and target the components generating a majority of the heat, especially when there are multiple high-power components along an air flow path.

In the instant disclosure, methods, systems, and devices are provided that enable component direct cooling. In various examples, chip sockets are provided with channels configured to direct a cooling flow to a specific component, for example a processor disposed on a PCB. The cooling flow may be provided via a cooling system coupled to an ingress channel on a chip socket. In additional examples, egress channels may be provided to direct the cooling flow (once heated by the component) away from the computing component. By delivering a cooling flow directly to a component within a system, and in some embodiments, directing the heated flow away from the component, a closed loop cooling methodology may enable configurable cooling. As used herein, a flow, is any substance (e.g., air, water, etc.) provided to a component to absorb and direct heat away from the component.

Figure 1:
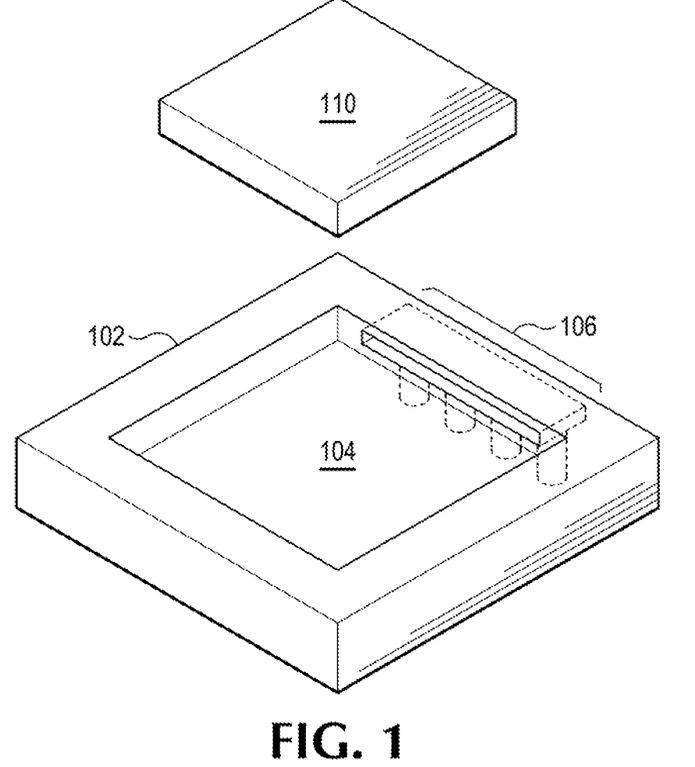
FIG. 1 illustrates an exploded view of a chip socket in accordance with an example of the present disclosure.

Referring to FIG. 1, a chip socket is illustrated in accordance with an example of the present disclosure. The chip socket 102 includes a cavity 104 and a channel 106. The cavity 104 may be configured for use with one or more components such as computing component 110. As used herein a computing component 110 is any device that may be coupled to a PCB for use with a system. Computing component 110 may be an integrated circuit, an electrical component, optical component, multi-chip module or other component. Additionally, the computing component 110 may utilize other components such as a heat spreader device. While this disclosure will be discussed predominantly with reference to electrical components, it is not so limited.

Chip socket 102 comprises a cavity 104 to receive a component 110. The cavity 104, in various examples, may be sized such that it substantially contacts component 110 on multiple sides of the component packaging. Alternatively, the cavity 104 may be sized such that pockets are available to allow a cooling flow to circulate around the component 110. In additional examples, the cavity 104 may be configured for use with multiple components 110.

The chip socket 102 includes a channel 106 to provide ingress for a cooling flow that is to facilitate cooling of a component which may be disposed therein. While one channel 106 is illustrated to be on a side of the chip socket 102, it is contemplated that additional channels having varying sizes, shapes and on additional or different sides may be used without deviating from the scope of the disclosure. A channel as used herein is any structure that enables a cooling flow into or out of a cavity. In the illustrated example, the channel 106 is configured to facilitate cooling of the component 110. Cooling flows may comprise cool air, pressurized air flows, liquids, gels, or other materials which may facilitate either the movement of cooling air to the component 110 or the removal of heat from the component 110.

In various examples, the chip socket 102 may be mounted on a PCB (not illustrated) to form a PCA. While the channel 106 is disposed on a single side of the chip socket 102, in examples with additional channels, channels may be disposed on multiple sides of the chip socket 102 including, but not limited to, cavity walls or a support surface of cavity 104.

Figure 2:
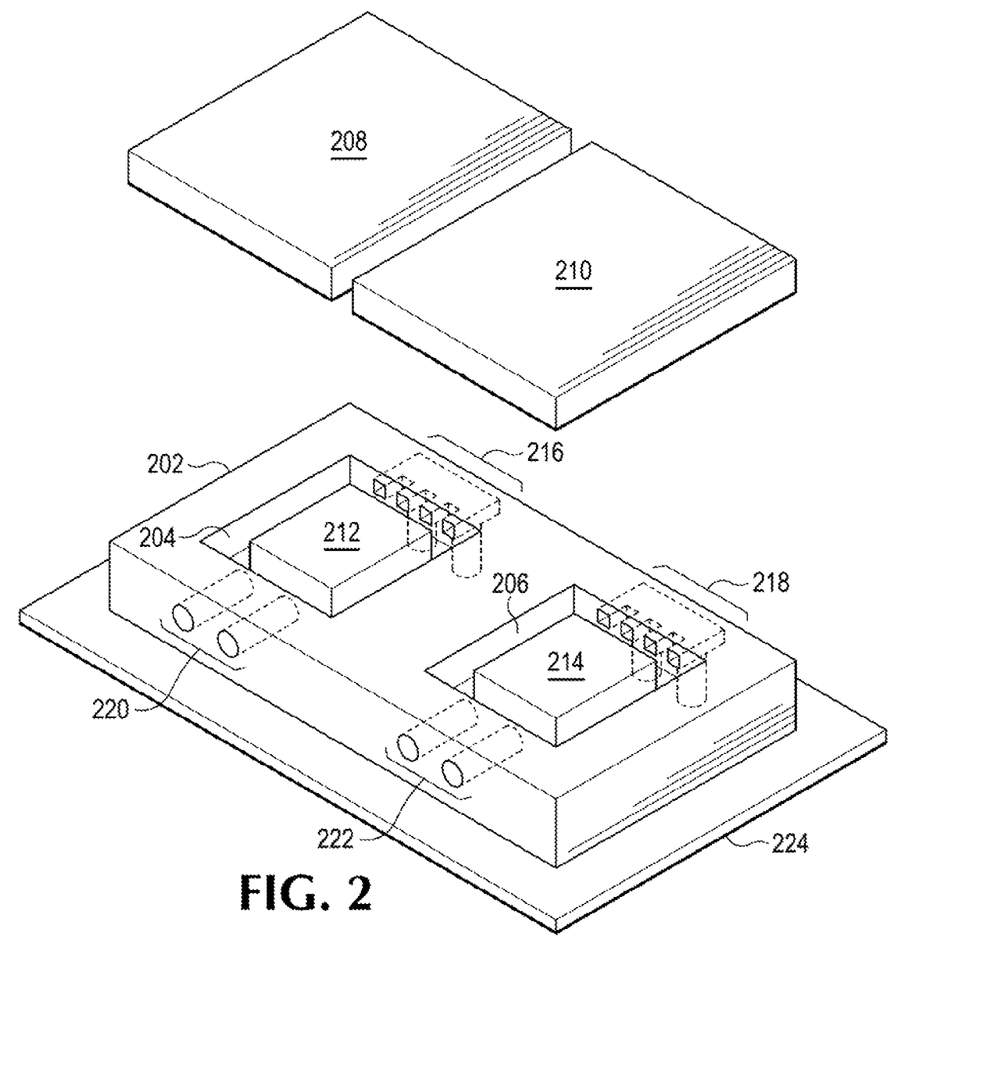
FIG. 2 illustrates an exploded view of a multi-chip socket in accordance with an example of the present disclosure.

Referring to FIG. 2, another example system is illustrated in accordance with an example of the present disclosure. In FIG. 2, a multi-chip socket 202 is illustrated with a first cavity 204 and a second cavity 206. The multi-chip socket 202 is configured to couple to a first cover 208 and a second cover 210. The two covers 208, 210 are configured to encapsulate, respectively, the first cavity 204 and the second cavity 206, including any components 212, 214 disposed therein. The covers may be configured to provide a micro-climate to the components 212, 214 therein. A micro-climate as used herein is any climate proximal to the component which is capable of being differentiated from a larger climate, for example the interior environment of the computing device in which the multi-chip socket 202 is disposed.

The covers 208, 210 may couple to the multi-chip socket 202 via an adhesive or mechanical fixture. In other examples, the covers 208, 210 may couple to the PCB 224 and encapsulate portions of the multi-chip socket 202. While two covers 208, 210 are illustrated as covering individual cavities 204, 206, in other examples a single cover may be utilized for both cavities. Utilizing two covers 208, 210, may enable the provision of independent micro-climates for the first cavity 204 and the second cavity 206. In various examples, the micro-climates provided to the cavities 204, 206 may be sustained via the use of seals, insulation, and dwells, as will be discussed in more detail herein.

In the illustrated example, the first cavity 204 and the second cavity 206 include ingress channels 216, 218, respectively. The channels are illustrated as being disposed on one side of the multi-chip socket 202. Egress channels 220, 222 are disposed opposite the ingress channels 216, 218 such that a cooling flow encircles and passes around the components 212, 214 disposed therein. The cavities 204, 206 are illustrated as being larger than the components 212, 214, respectively, to provide air pockets, or areas around the components. In one example, compressed, cool air is provided through the ingress channels 216, 218. In addition to being cool, the compressed air may be allowed to expand while transitioning from the narrower ingress channels 216, 218 to the air pockets. The expansion of the compressed air may provide a cooling effect in addition to the initial cooling of the flow. The area of the egress channels may be larger than the area of the ingress channels within a pocket to enable the expanded air to egress more efficiently.

Figure 3:
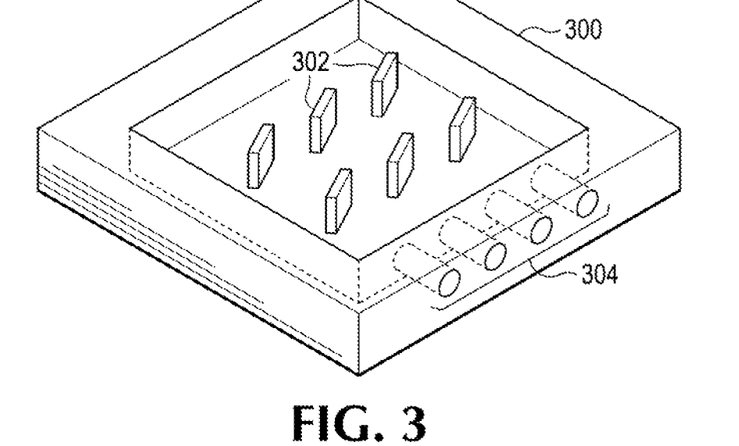
FIG. 3 illustrates a perspective view of a cover corresponding to a chip socket in accordance with an example of the present disclosure.

Referring to FIG. 3, an example of a cover is illustrated (upside down) in accordance with the present disclosure. The cover 300 may be configured to couple to a chip socket or multi-chip socket as described with reference to FIGS. 1 and 2. The cover 300 includes a plurality of channels 304 which may be utilized in different combinations. For example, the plurality of channels 304 may comprise solely ingress channels or egress channels for a cooling flow, or a combination of ingress channels and egress channels for a cooling flow. In addition, cover 300 includes a plurality of dwells 302. Dwells 302 are fins or other obstructions which are utilized to interrupt a cooling flow as it enters and exits a cavity and/or cover. The dwells 302 may be configured to delay the cooling flow relative to the component to increase the amount of heat absorbed by the cooling flow and/or to provide a more directed air towards hot-spot areas of the component. The arrangement and number of dwells may vary from example to example. In other examples, dwells may be utilized within a cavity of chip socket or multi-chip socket.

Figure 4:
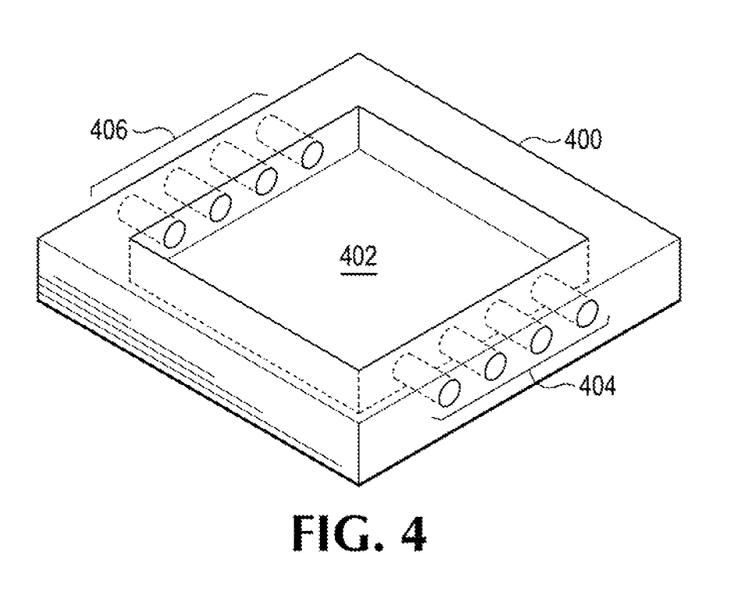
FIG. 4 illustrates a perspective view of a cover in accordance with an example of the present disclosure.

Referring to FIG. 4, an example of a cover is illustrated (upside down) in accordance with the present disclosure. The cover 400 comprises a cavity 402, a first set of channels 404, and a second set of channels 406. The first and second sets of channels 404, 406 may be configured as ingress and egress channels for a cooling flow, wherein the cooling flow is to facilitate cooling of a component when disposed within the cavity 402. The cover 400 may be configured to provide a micro-climate to a component (not illustrated). In various examples, the cover 400 may be configured to provide a micro-climate to a component disposed within a chip socket as described with reference to the preceding figures, or alternatively, maybe configured to provision a micro-climate to components not utilizing chip sockets.

For example, cover 400 may be configured to couple to a chip platform, printed circuit board, or other base. A chip platform, as used here, is a chip module which does not utilize a cavity. For example, a chip platform may be a chip module which utilizes one or more rails or guides for proper alignment of components disposed thereon. In these examples, the cover 400 may be configured to encapsulate the components, portions of the PCB, portions of the chip platform, or the chip platform itself to enable the provision of a micro-climate. The cover 400 may be configured with cavities in a manner similar to a chip socket such that one or more components may be encapsulated in a variety of ways. The cover 400 may include a single cavity for one or more components or may incorporate multiple cavities for multiple components. While illustrated as a cover 400 with a single cavity 402 and a plurality of channels 404, 406, it is expressly contemplated that additional cavities utilizing more or fewer channels may be utilized without deviating from the scope of the disclosure. The cover 400 may include dwells (not illustrated) in the cavity area 402.

In another example, the cover 400 may include other components to interface with the component to be encapsulated by the cover 400. In one example, the cover 400 may comprise a first layer of heat insulated material (e.g., plastic) and a second layer configured to interface with a component encapsulated therein. The second layer may comprise a heat conducting material with heat spreading shapes (e.g., fins). When the cover is moved into position over a component, the first layer may provide a micro-climate to the component, while the second layer may interface with the component and interact with the micro-climate to facilitate heat dissipation. In yet another example, the cover 400 may comprise a partitioning wall (not illustrated) to provide different micro-climates within a cavity for a component or different components. Other components and configurations are contemplated.

Figure 5:
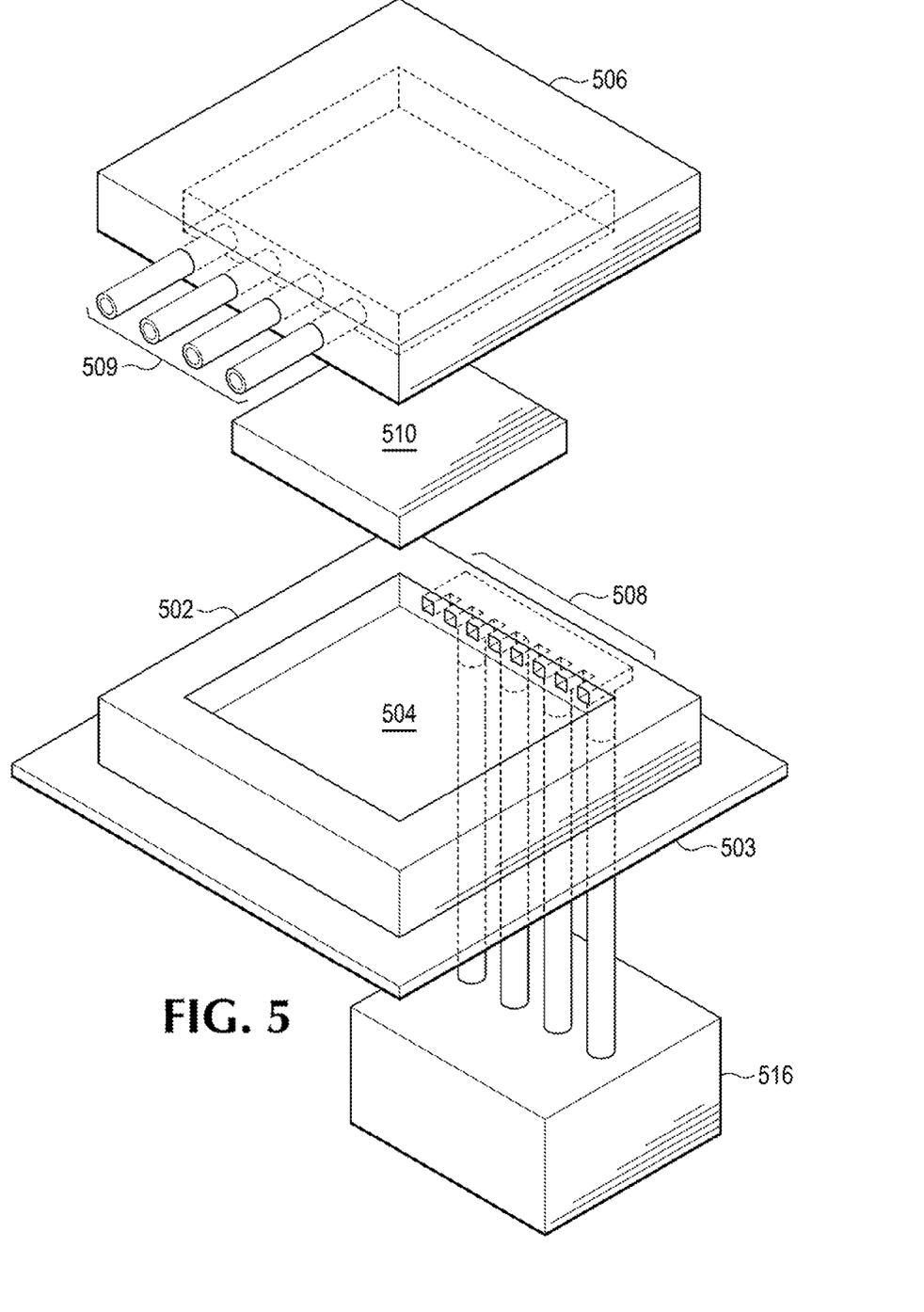
FIG. 5 illustrates a system in accordance with an example of the present disclosure.

Referring to FIG. 5, a system 500 is illustrated in accordance with another example of the present disclosure. The system 500 includes a chip socket 502 to couple a component 510 to a printed circuit board 503. The chip socket 502 includes a cavity 504 for the component 510 in addition to providing an air pocket surrounding the component 510. The system 500 further comprises a cover 506 that may be coupled to and removed from the chip socket 502 and/or PCB 503. The cover 506 is to encapsulate the component 510 and the cavity 504 to sustain a micro-climate for the component 510. Coupled to the chip socket 502 is a cooling flow system 516 which is to generate the micro-climate. The cooling flow system 516 is to provision the micro-climate via a plurality of channels 508, 509. The plurality of channels 508, 509 may comprise various combinations of ingress and egress channels.

In the illustrated example the cooling flow system 516 provides a cooling flow to the cavity 504 of the chip socket 502 to effectively cool the component 510. The cooling flow system 516 provides the cooling flow through an ingress channel 508. To exhaust the cooling flow, the cooling flow system 516 may utilize egress channels 509. While illustrated as having the ingress channels 508 disposed within the chip socket 502 and the egress channels 509 disposed within the cover 506, other combinations and dispositions of both the ingress channels 508 and the egress channels 509 are contemplated.

In the illustrated example, the cover 506 when coupled to the chip socket 502, enables the use of a micro-climate. The micro-climate conditions such as temperature, air flow, relative humidity, pressure, etc. may be measured by one or more sensors disposed within the cavity. The micro-climate may be monitored and controlled via the cooling flow system 516. In one example, the cooling flow system 516 may provide cooled air having a temperature substantially below the ambient temperature within the overall system external to the chip socket 502 and the cover 506. In this manner, component 510 may be maintained within an optimal operating environment.

In various other examples, the cooling flow system 516 may incorporate other elements to facilitate provision of the micro-climate. For example, the cooling flow system 516 may incorporate active and/or passive flow control devices (not illustrated) such as louvers, fins, fans, filters, and other devices which may be controlled by one or more controllers (not illustrated). The active and/or passive flow control devices may be utilized to vary various characteristics of the micro-climate such as temperature, air flow, relative humidity, pressure, etc. In addition, the cooling flow system may incorporate one or more sensors disposed outside of the micro-climate. The one or more sensors disposed outside of the micro-climate may enable the controller to determine information related to the integrity and efficiency of the system, for example, if there are any leaks, the temperature of the cooling flow leaving the micro-climate, etc.

Figure 6:
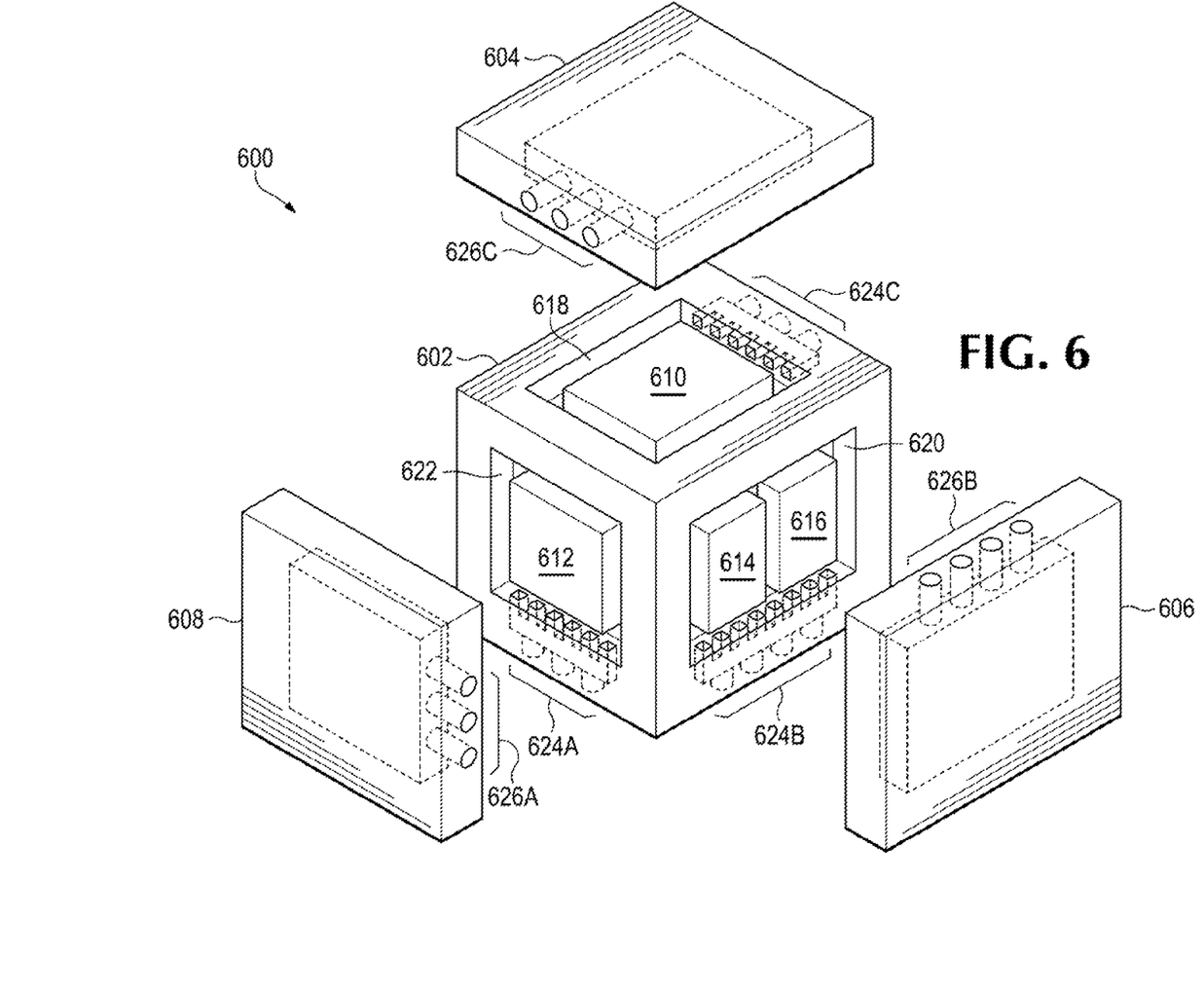
FIG. 6 illustrates another example of a multi-chip socket in accordance with the present disclosure.

Referring to FIG. 6, another example of a system is illustrated in accordance with an example of the present disclosure. The system 600 includes chip socket 602 including a plurality of cavities 618, 620, 622. The chip socket 602 is configured to couple with a plurality of covers 604, 606, 608, to provide a plurality of micro-climates to the individual cavities 618, 620, 622, respectively. As illustrated, one or more components 610, 612, 614, 616 may be disposed within each of the cavities. Groupings within cavities may be determined based upon the need for a similar micro-climate, similarity of devices, or collective operating temperatures of the various devices, among others.

In the illustrated example, each cavity includes an ingress channel 624A-C integral with the chip socket 602 and an egress channel 626A-C integral with a cover 604, 606, 608. When coupled to each other, various micro-climates may be created. This may enable, for example, a first component 610 to operate a first temperature, a second component 612 to operate at a second temperature, and a third component 614 to operate a third temperature. To facilitate independent micro-climates, thermal barriers (not illustrated) may be incorporated into the structure of the chip socket 602 and/or the covers 604-608. In addition to the micro-climates provided by the various covers 604-608, dust and other damaging particles may be prevented from accumulating within the various cavities via filters and/or gaskets disposed within the chip sockets 602 or within a cooling flow system providing the cooling flow.

In the illustrated example, one component 616 disposed within the chip socket 602 may be configured to communicate with a controller of the system incorporating the chip socket 602. The component 616 may be configured to convey information or data related to the chip socket and incorporated components. The component 616 may be an electrically erasable programmable read only memory (EEPROM) or other non-volatile memory that conveys the data through a direct coupling. Alternatively, other configuration chips and communication protocols such as radio frequency identifier (RFID) tags, near field communication (NFC) tags, among others, may be used on the chip socket either within or outside of the covers. The component 616 may describe the contents of each cavity, the capabilities of various components within the cavities, the cavity designs, the types of sensors installed, the manufacturer, service dates, or other management information to a controller.

Figure 7:
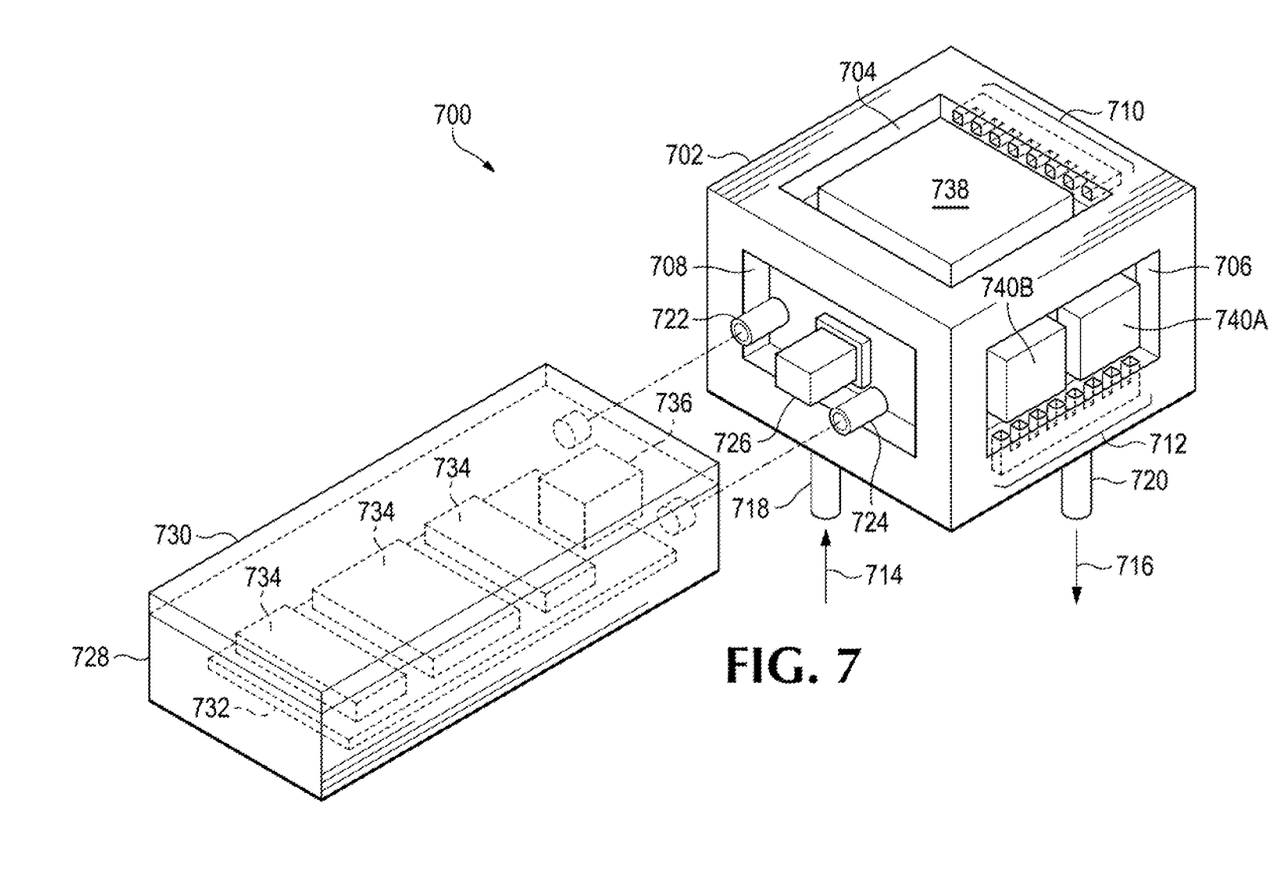
FIG. 7 illustrates another example of a multi-chip socket in accordance with the present disclosure.

Referring to FIG. 7, another example of a system is illustrated in accordance with the present disclosure. System 700 includes a chip socket 702 which is configured, to couple with an adapter 728. The system 700 is to provision another micro-climate to the adapter 728 via one or more extension channels 722, 724.

In the illustrated example, chip socket 702 includes a first cavity 704, a second cavity 706, and third cavity 708. The chip socket 702 is configured to interface with a cooling flow system via one or more channels such as ingress channel 718 and egress channel 720. The ingress channel 718 receiving an ingress flow 714 and the egress channel 720 exhausting the flow 716. The cooling flow may be provided to the various cavities 704-708 via channels within the chip socket 702 to provide micro-climates for various components.

For example, cavity 704 is configured to couple with component 738 and provide a cooling flow to component 738 via ingress channels 710. Cavity 706 is to interface with components 740A, B and provide a cooling flow to components 740A, B via ingress channel 712. Cavities 704 and 706 may be configured for use with one or more covers as previously discussed, or may be utilized without covers thereby negating the need for egress channels associated with the respective cavities.

In the illustrated example, cavity 708 may be configured to extend the use of a cooling flow system to additional components, such as after-market components. Cavity 708 includes the extension channels 722 and 724 to provide access to the cooling flow system (not illustrated). In addition, the cavity 708 may include connectors 726 to couple to electrical and optical components of the after-market components or adapters 728. As used herein, an adapter may be any component capable of a connection with the chip socket 702.

The adapter 728 may include a cover 730 which is utilized (similar to a chip socket) to provision a micro-climate to components therein. The adapter may include one or more components 734 disposed on a PCB 732 (or other base) and receive a cooling flow via an ingress channel 722 and exhaust the cooling flow via an egress channel 724. In addition to the cooling flow connections, an adapter may also include connector 736 which provision signals, such as electrical or optical signals, among others to couple with the connector 726 on the chip socket. The coupling may enable an adapter 728 to couple to the computing device via the chip socket, and enable the computing system to provision a micro-climate to the adapter 728 via the chip socket 702.

Figure 8:
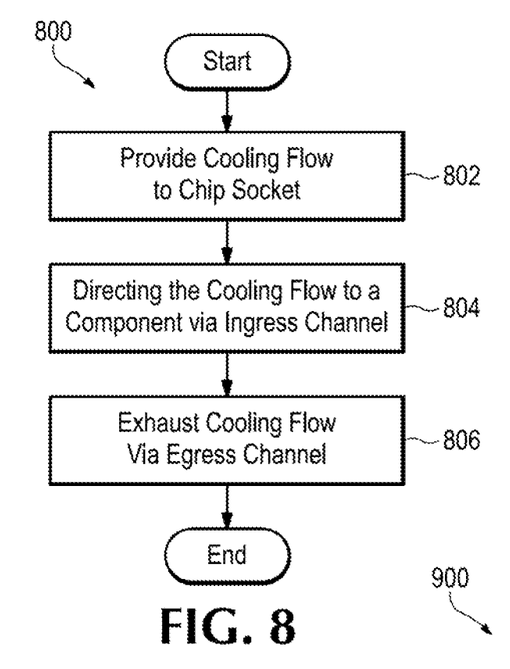
FIGS. 8-9 illustrate example flow diagrams in accordance with the present disclosure.
Figure 9:
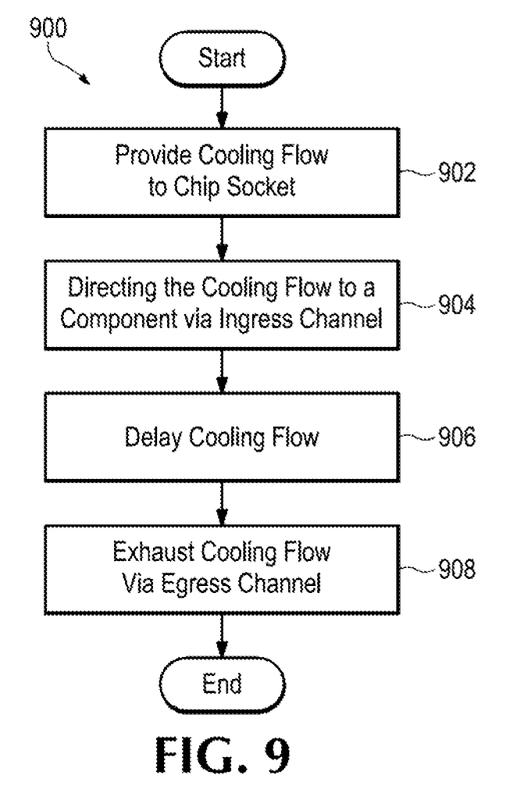

Referring to FIGS. 8 and 9, flow diagrams are illustrated in accordance with various examples of the present disclosure. The flow diagrams represent processes that may be utilized in conjunction with various systems and devices as discussed with reference to the preceding figures. While illustrated in a particular order, the disclosure is not intended to be so limited. Rather, it is expressly contemplated that various processes may occur in different orders and/or simultaneously with other processes than those illustrated.

Referring to FIG. 8, a method 800 may begin and progress to 802 where a cooling system may provide a cooling flow to a chip socket. The cooling flow may be provided via a system of channels. In various examples, the cooling flow may include cooled, compressed air. The cooled compressed air, may have a temperature between approximately thirty-two degrees Fahrenheit (~32° F.) and seventy degrees (~70° F.).

Other temperatures and operating conditions are contemplated.

Upon providing the cooling flow to the chip socket, the cooling flow may be directed to a component disposed within the chip socket via an ingress channel at 804. The ingress channel may direct the cooling flow directly at the component, or alternatively, may direct the cooling flow into an, air pocket. The cooling flow, may be allowed to circulate the component. At 806, the cooling flow may then be exhausted via an egress channel. The egress channel may be integral with the chip socket or may be integral with a cover configured to couple to the chip socket. Exhausting the cooling flow may enable additional cooling flow to be directed toward the component creating a closed loop cooling cycle.

Referring to FIG. 9, another example flow diagram is illustrated. Similar to the previous flow diagram, the method 900 may begin and progress to 902 where a cooling flow is provided to a chip socket. The cooling flow may be provided via a system of channels. In various examples, the cooling flow may include cooled, compressed air. The cooled compressed air, may have a temperature between approximately thirty-two degrees Fahrenheit (~32° F.) and seventy degrees (~70° F.). Other temperatures and operating conditions are contemplated.

The cooling flow may be directed toward the component via an ingress channel at 904. The ingress channel may comprise one or more channels configured to direct the cooling flow onto or around the component. Upon leaving the ingress channel, in various examples, the cooling flow may be allowed to expand providing additional cooling benefits, as previously mentioned.

At 906, the cooling flow may be delayed relative to the ingress and egress channels. The delay may be in response to the cooling flow being directed in one or more directions via one or more dwells. The dwells may direct the cooling flow away from an egress channel thereby disrupting the cooling flows immediate exhaust from the chip socket. At 908, the cooling flow may be exhausted via the egress channel. In various examples, exhausting the cooling flow may include exhausting the cooling flow via an egress channel disposed on a cover corresponding to the chip socket, or alternatively, exhausting the cooling flow via an egress channel disposed on one or more sides of a chip socket.

Although certain embodiments have been illustrated and described herein, it will be appreciated by those of ordinary skill in the art that a wide variety of alternate and/or equivalent embodiments or implementations calculated to achieve the same purposes may be substituted for the embodiments shown and described without departing from the scope of this disclosure. Those with skill in the art will readily appreciate that embodiments may be implemented in a wide variety of ways. This application is intended to cover any adaptations or variations of the embodiments discussed herein. Therefore, it is manifestly intended that embodiments be limited only by the claims and the equivalents thereof.

What is claimed is:

1. An apparatus, comprising:
a cavity to receive a component;
a channel coupled to the cavity to provide ingress for a cooling flow, wherein the cooling flow is to facilitate cooling of the component when coupled to the cavity; and
a connector to couple to an adapter, wherein the cooling flow is to provision a micro-climate to another component within the adapter via extension channels coupled to the cavity.

2. The apparatus of claim 1, further comprising: a cover configured to encapsulate the cavity and the channel, wherein the cover is configured to provide another micro-climate to the component within the cavity.

3. The apparatus of claim 2, further comprising:
a second channel coupled to the cavity, wherein the second channel is to provide an egress for the cooling flow.

4. The apparatus of claim 2, wherein the cover comprises a channel to provide an egress for the cooling flow.

5. The apparatus of claim 2, wherein the cover comprises a dwell to delay the cooling flow relative to the component.

6. The apparatus of claim 1, further comprising:
a second cavity to receive a second component, wherein the second cavity includes a plurality of channels to ingress and egress another cooling flow.

7. The apparatus of claim 6, further comprising:
a cover configured to encapsulate the second cavity and the plurality of channels.

8. The apparatus of claim 1, further comprising:
the component disposed within the cavity.

9. The apparatus of claim 1, wherein the cavity and channel are configured to enable pressurized air to expand and cool the cavity upon ingress from the channel.

10. A system comprising:
a chip socket to couple a component to a printed circuit board, wherein the chip socket includes a cavity for the component and an air pocket, wherein the chip socket further comprises a connector to couple to an adapter;
a cover removably coupled to the chip socket, wherein the cover is to encapsulate the component and the air pocket to sustain a micro-climate for the component; and
a cooling flow system to generate the micro-climate, wherein the cooling flow system provisions the micro-climate via a plurality of channels, and wherein the cooling flow system is to provision another micro-climate to another component within the adapter via extension channels of the chip socket.

11. The system of claim 10, wherein the plurality of channels comprises an ingress channel integrated with the chip socket and an egress channel integrated with the cover.

12. The system of claim 10, wherein the plurality of channels comprises an ingress channel integrated with the cover and an egress channel integrated with the chip socket.

13. The system of claim 10, wherein the plurality of channels comprises an ingress channel and an egress channel integrated with either the chip socket or the cover.

14. The system of claim 10, further comprising:
a dwell coupled to either the chip socket or the cover, wherein the dwell is to delay a cooling flow provided by the cooling flow system to sustain the micro-climate.

15. The system of claim 10, wherein the chip socket includes a second cavity configured for a second component.

16. The system of claim 15, wherein the cooling flow system is configured to generate a second micro-climate for the second component, the second micro-climate being different than the micro-climate.

17. A method, comprising:
providing an cooling flow to chip socket;
directing the cooling flow to a component disposed within the chip socket via, an ingress channel;
directing the cooling flow to an adapter coupled to the chip socket via a connector, wherein the cooling flow is to provision a micro-climate to another component within the adapter via extension channels of the chip socket; and
exhausting the cooling flow from the chip socket via an egress channel.

18. The method of claim 17, further comprising:
delaying the cooling flow on the component via one or more dwells prior to exhausting the cooling flow.

19. The method of claim 17, wherein the ingress channel is disposed on a cover of the chip socket and the egress channel is disposed on a base of the chip socket.

* * * * *